(12) United States Patent
Lee et al.

(10) Patent No.: US 7,098,473 B2
(45) Date of Patent: Aug. 29, 2006

(54) THIN FILM TRANSISTOR, AND ORGANIC EL DISPLAY THEREOF

(75) Inventors: Jae Man Lee, Seoul (KR); Hong Gyu Kim, Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/162,761

(22) Filed: Jun. 6, 2002

(65) Prior Publication Data

US 2002/0190332 A1  Dec. 19, 2002

(30) Foreign Application Priority Data

Jun. 15, 2001  (KR) ............................... 2001-33999

(51) Int. Cl.
*H01L 29/76* (2006.01)
(52) U.S. Cl. ..................... 257/40; 257/59; 257/72; 257/347; 257/350; 257/E39.007
(58) Field of Classification Search ............ 257/40, 257/350, 347, 59, 72, E39.007
See application file for complete search history.

(56) References Cited

U.S. PATENT DOCUMENTS

| | | | | |
|---|---|---|---|---|
| 3,969,753 | A * | 7/1976 | Thorsen et al. | ............. 257/507 |
| 4,755,481 | A * | 7/1988 | Faraone | ....................... 438/165 |
| 5,304,426 | A * | 4/1994 | Grensing | ..................... 428/552 |
| 5,389,580 | A * | 2/1995 | Miyasaka | .................... 438/479 |
| 5,956,104 | A * | 9/1999 | Hayashi et al. | ................ 349/42 |
| 6,384,427 | B1 * | 5/2002 | Yamazaki et al. | ............. 257/59 |
| 6,424,012 | B1 * | 7/2002 | Kawasaki et al. | .......... 257/350 |
| 6,433,487 | B1 * | 8/2002 | Yamazaki | ................. 315/169.3 |
| 6,462,723 | B1 * | 10/2002 | Yamazaki et al. | ............. 345/82 |
| 6,515,428 | B1 * | 2/2003 | Yeh et al. | ................. 315/169.3 |
| 6,545,359 | B1 * | 4/2003 | Ohtani et al. | ................ 257/758 |
| 6,587,086 | B1 * | 7/2003 | Koyama | ....................... 345/77 |
| 6,590,227 | B1 * | 7/2003 | Ishikawa | ...................... 257/68 |
| 6,593,691 | B1 * | 7/2003 | Nishi et al. | .................. 313/506 |
| 6,641,933 | B1 * | 11/2003 | Yamazaki et al. | .......... 428/690 |
| 6,680,577 | B1 * | 1/2004 | Inukai et al. | ............. 315/169.3 |

FOREIGN PATENT DOCUMENTS

| | | |
|---|---|---|
| JP | 60-201663 | 10/1985 |
| JP | 2000-098930 | 4/2000 |
| JP | 2000-340721 | 12/2000 |
| JP | 2000-353809 | 12/2000 |
| JP | 2001-057290 | 2/2001 |
| JP | 2001-068272 | 3/2001 |
| JP | 2002-108250 | 4/2002 |

* cited by examiner

*Primary Examiner*—Eugene Lee
(74) *Attorney, Agent, or Firm*—Fleshner & Kim, LLP

(57) ABSTRACT

Thin film transistor, and organic EL display of the same and method for fabricating the same, including a high temperature substrate of metal or ceramic, a semiconductor layer formed in a region of the substrate having a source region and a drain region, a source electrode in contact with the source region in the semiconductor layer for use as a data line, a pixel electrode formed in each of the pixel region in contact with the drain region in the semiconductor layer, an organic EL layer formed on the pixel electrode, a common electrode formed on the organic EL layer, and a transparent protection film on the common electrode.

2 Claims, 5 Drawing Sheets

P or B

P or B

THIN FILM TRANSISTOR, AND ORGANIC EL DISPLAY THEREOF

This application claims the benefit of the Korean Application No. P2001-0033999 filed on Jun. 15, 2001, which is hereby incorporated by reference.

BACKGROUND OF THE INVENTION

1. Field of the Invention

The present invention relates to a thin film transistor (TFT), and more particularly, to a thin film transistor having a high temperature substrate, and an organic EL display of an active driving type of the same, and a method for fabricating the same.

2. Background of the Related Art

In general, a semiconductor thin film used in the thin film transistor is formed by crystallizing an amorphous silicon film formed by plasma CVD or thermal CVD in a furnace, like an electric furnace, for more than 12 hours at a temperature higher than 600° C.

For obtaining a high quality semiconductor thin film having an excellent field effect mobility and a high reliability, it is required that the amorphous silicon film is heat treated for a long time.

Moreover, since it is required that a substrate in a display permits a light to transmit therethrough, the substrate is transparent. For fabricating the thin film transistor on the transparent substrate, it is required that a silicon semiconductor film is formed on the transparent substrate. Since glass, which can be used in a low temperature, is used as the substrate, it is required that the silicon semiconductor film formed on the substrate is amorphous, which can be formed at a low temperature. Then, the amorphous silicon is crystallized for obtaining a fast response of the TFT. However, the substrate can be deformed during a high temperature heat treatment of crystallization of the amorphous silicon film.

In general, the substrate of the TFT is formed of silica glass, or non-alkali borosilicate glass. The substrate of silica glass has an excellent heat resistance, to suit to a high temperature process. The silica glass shows no deformation in a heat treatment at approx. 1000° C. However, the silica glass is very expensive in comparison to non-alkali borosilicate glass, which is increased by a geometric progression as a size of the substrate is increased. Therefore, the silica glass is not suitable for a large sized display due to the high cost.

In the meantime, though the non-alkali borosilicate glass is not expensive compared to the silica glass, the non-alkali borosilicate glass is not suitable for a high temperature process due to a poor heat resistance. That is, the non-alkali borosilicate glass deforms even in a heat treatment at approx. 600° C., which is particularly significant for a large sized substrate with a diagonal length greater than 10 inches.

Accordingly, though the non-alkali borosilicate glass has mostly been used for displays owing to the low cost, performance of the thin film transistor is not good due to low temperature crystallization of the semiconductor.

SUMMARY OF THE INVENTION

Accordingly, the present invention is directed to a thin film transistor, and an organic EL display of the same and a method for fabricating the same that substantially obviates one or more of the problems due to limitations and disadvantages of the related art.

An object of the present invention is to provide a thin film transistor which permits a high temperature process and has a good performance, and an organic EL display of the same and a method for fabricating the same.

Another object of the present invention is to provide a thin film transistor which can drop process cost and enhance a production efficiency, and an organic EL display of the same and a method for fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor includes a semiconductor layer, a gate insulating film, a gate electrode formed on a substrate in succession, wherein the substrate is a high temperature substrate formed of a metal or ceramic.

The substrate has no deformation at a temperature ranging 500–1500° C.

The metal is one selected from a group of materials including low carbon steel, high carbon steel, copper, bronze, tungsten, gold, zinc, and titanium, and an alloy of the materials, and the ceramic is one selected from a group of material including AlN group, $Al_2O_3$ group, BeO group, SiC group, and MgO group.

The substrate has oxide films on top and bottom surfaces thereof, when the substrate is formed of metal.

In another aspect of the present invention, there is provided an organic EL display including a substrate of metal or ceramic, a semiconductor layer formed in a region of the substrate having a source region and a drain region, a source electrode in contact with the source region in the semiconductor layer for use as a data line, a pixel electrode formed in each of the pixel region in contact with the drain region in the semiconductor layer, an organic EL layer formed on the pixel electrode, a common electrode formed on the organic EL layer, and a transparent protection film on the common electrode.

The organic EL display further includes a black matrix layer formed on the source electrode to cover the source electrode, for shielding a light.

In further aspect of the present invention, there is provided a method for fabricating an organic EL display, including the steps of (a) providing a substrate of metal or ceramic, (b) forming a semiconductor layer in a region of the substrate, and forming a gate insulating film on an entire surface of the substrate, inclusive of the semiconductor layer, (c) forming a gate line on the gate insulating film to pass a region of the semiconductor layer, and injecting impurity ions with the gate line used as a mask, to form a source region and a drain region, (d) forming a first interlayer insulating film on an entire surface inclusive of the gate line, and forming a source electrode to be used as a data line on the first interlayer insulating film in contact with the source region in the semiconductor layer, (e) forming a second interlayer insulating film on an entire surface of the substrate, inclusive of the source electrode, and forming a black matrix layer on the second interlayer insulating film to cover the source electrode, (f) forming a planarization film on an entire surface inclusive of the black matrix layer, and forming a pixel electrode on the planarization film in contact with the drain region in the semiconductor layer, (g) forming an organic EL layer on an entire surface inclusive of the pixel electrode, forming a common electrode in a region of the organic EL layer, and (h) forming a transparent protection film on an entire surface inclusive of the common electrode.

The step (a) includes the steps of polishing, and planarizing a surface of the substrate, and cleaning the surface of the substrate.

The method further includes the steps of heat treating the substrate to form oxide films on surfaces of the substrate after the step of cleaning the surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

The present invention suggests employing a substrate suitable for a high temperature fabrication process in fabrication of a low cost thin film transistor having an excellent performance, and fabrication of an organic EL display by using the same. It is required that the substrate suitable for a high temperature fabrication process of the present invention shows no deformation within a temperature range of approx. 500–1500° C.

Accordingly, the present invention employs metal, such as low carbon steel, high carbon steel, copper, bronze, tungsten, gold, zinc, titanium, and the like, or an alloy of the metal as a material of the substrate, or ceramic, such as AlN group, $Al_2O_3$ group, BeO group, SiC group, MgO group, or the like as a material of the substrate. Titanium is the most suitable for fabrication of a large sized display because fabrication and handling is easy and cost is low.

Therefore, as a preferred embodiment of the present invention, a method for fabricating a thin film transistor of titanium substrate, and a method for fabricating an organic EL display by using the same will be explained, with reference to the attached drawings. FIGS. 1A–1M illustrate sections showing the steps of a method for fabricating an organic EL display in accordance with a preferred embodiment of the present invention.

A desired size of substrate is formed of titanium Ti, subjected to chemical, and mechanical polishing to have a flatness suitable for a display, and cleaned by cleaning liquid for removal of impurities from the surface of the substrate.

Figure 1A:
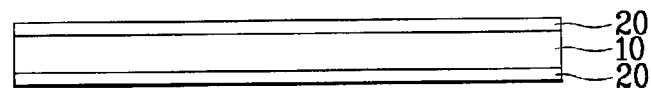
FIGS. 1A–1M illustrate sections showing the steps of a method for fabricating an organic EL display in accordance with a preferred embodiment of the present invention.

Then, referring to FIG. 1A, an oxide film 20 is formed on top and bottom surfaces of the substrate 10, by heat treating the substrate itself at approx. 500–1000° C. under an oxygen atmosphere. The oxide film is formed for prevention of electric leakage to the substrate, and protection of the substrate from impurities and chemicals during fabrication. Therefore, if the substrate is not formed of metal, such as Ti, i.e., the substrate is formed of an insulating material, such as AlN group, $Al_2O_3$ group, BeO group, SiC group, MgO group, or the like, no oxide film 20 is required.

Figure 1B:
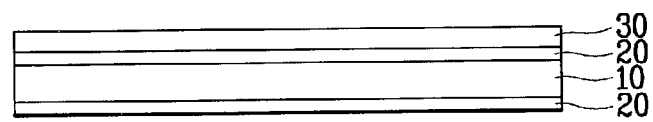

Then, referring to FIG. 1B, a buffer layer 30 is formed on the oxide film 20, for prevention of infiltration of impurities from the substrate 10 to a semiconductor layer formed in a later fabrication process for enhancing a performance of the semiconductor layer. The buffer layer 30 is formed of an insulating material, such as silicon oxide SiOx, silicon nitride SiNx, and the like.

Figure 1C:
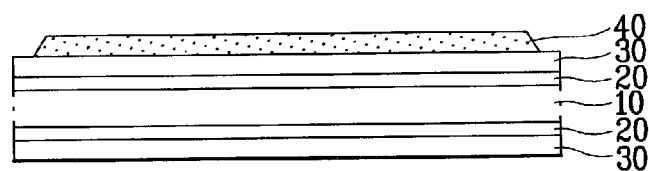

Referring to FIG. 1C, a semiconductor layer (polycrystalline silicon layer) 40 is formed on the buffer layer 30, for use as an active layer of a transistor. The semiconductor layer 40 may be formed by forming polycrystalline silicon on the substrate directly by means of physical deposition, such as CVD like LPCVD, or PECVD, evaporation, or sputtering, or by directing an excimer laser beam to amorphous silicon, or simply by heat treating the amorphous silicon in a furnace.

Figure 1D:
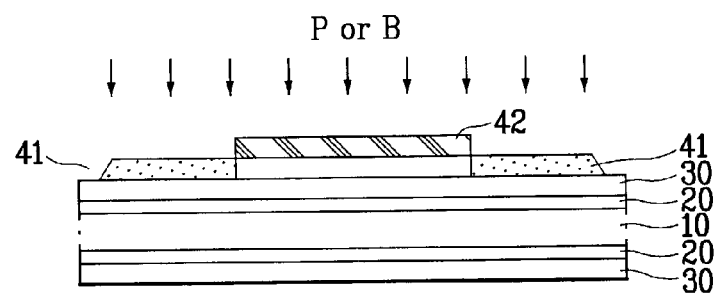
Figure 1E:
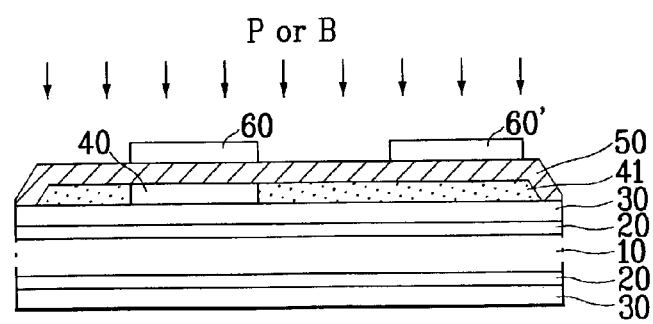

Referring to FIGS. 1D–1E, a photoresist film 42 is formed and patterned on the semiconductor layer 40, and B or P impurity ions are injected into the semiconductor layer 40 by using the photoresist film 42 as a mask, to form a lower electrode 41 of a storage capacitor. Then, the photoresist film 42 is removed, and a gate insulating film 50 is formed on an entire surface. A gate electrode material is deposited on the gate insulating film 50, and patterned, to form a gate electrode line (e.g., gate lines) 60 or 60'. Then, impurity ions are injected into the semiconductor layer 40, and the semiconductor layer 40 is heat treated, for defining source and drain regions of the transistor.

Figure 1F:
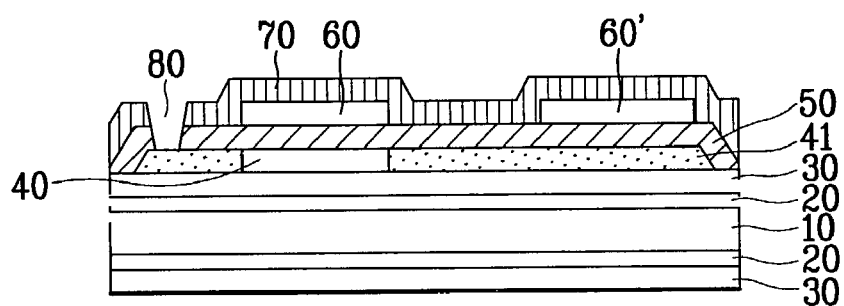

Next, referring to FIG. 1F, after a first interlayer insulating film 70 is formed on an entire surface, parts of the first interlayer insulating film 70, and the gate insulating film 50 over the source region of the device are removed, to form a first contact hole 80 exposing a part of the source region of the semiconductor layer 40.

Figure 1G:
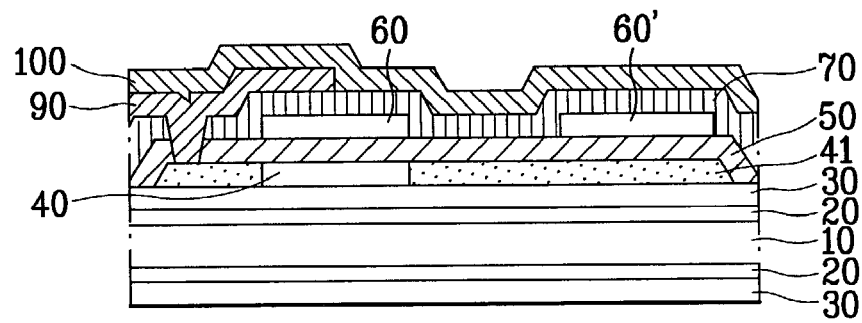

Referring to FIG. 1G, a source electrode (e.g., data line) 90 to be used as a data line is formed so as to be in contact with the source region of the semiconductor layer 40 through the first contact hole 80, and a second interlayer insulating film 100 is formed on an entire surface.

Figure 1H:
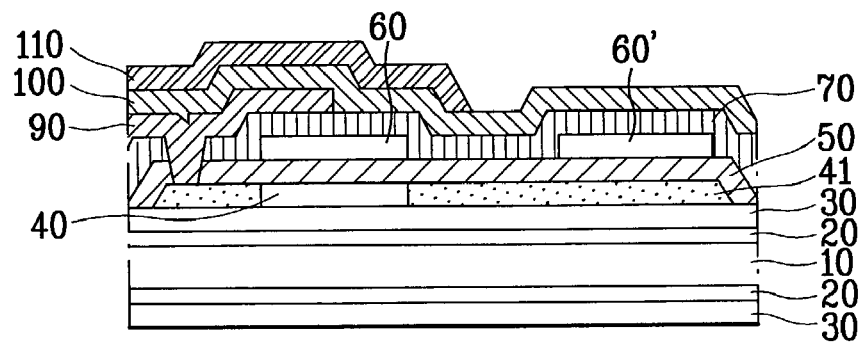
Figure 1I:
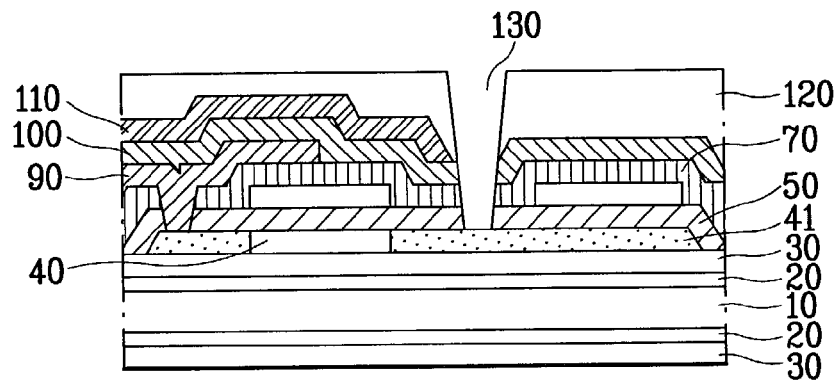

Then, referring to FIG. 1H, a black matrix layer 110 is formed on the second interlayer insulating film 100 to cover the source electrode 90, for shielding a light. The black matrix layer is formed for shield lights between pixels, and protection of the transistor from the light from an inside of the device.

Referring to 1I, a planarization film 120 is formed on an entire surface of the substrate, and parts of the planarization film 120, the first, and second insulating film 70, and 100, and the gate insulating film 50 over the drain region is removed to form a second contact hole 130 to expose a part of the drain region in the semiconductor layer 40. The planarization film 120 is formed of BPSG, BCB, SOG, and the like.

Figure 1J:
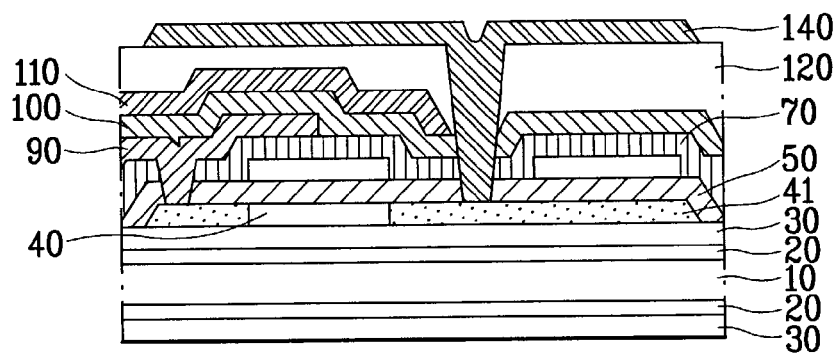

Referring to FIG. 1J, a pixel electrode 140 is formed on the planarization film 120 such that the pixel electrode 140 is in contact with the drain region in the semiconductor layer 40, thereby fabricating the thin film transistor.

Figure 1K:
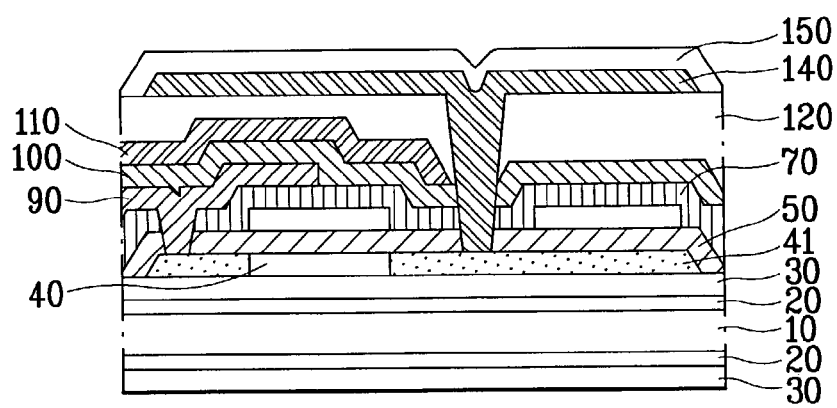

After fabrication of the thin film transistor thus, referring to FIG. 1K, a material, such as CuPC, and NPD, is deposited on an entire surface, to form a hole injection layer, and/or a hole transport layer 150.

Figure 1L:
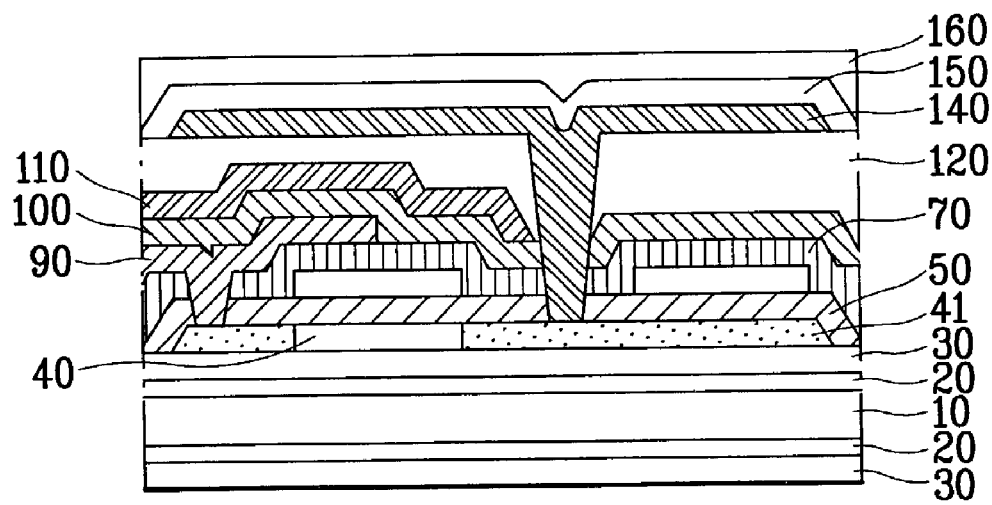

Referring to FIG. 1L, a material, such as Alq3 and dopant, is deposited on the hole injection layer, and/or the hole transport layer 150, to form an organic EL layer 160.

Figure 1M:
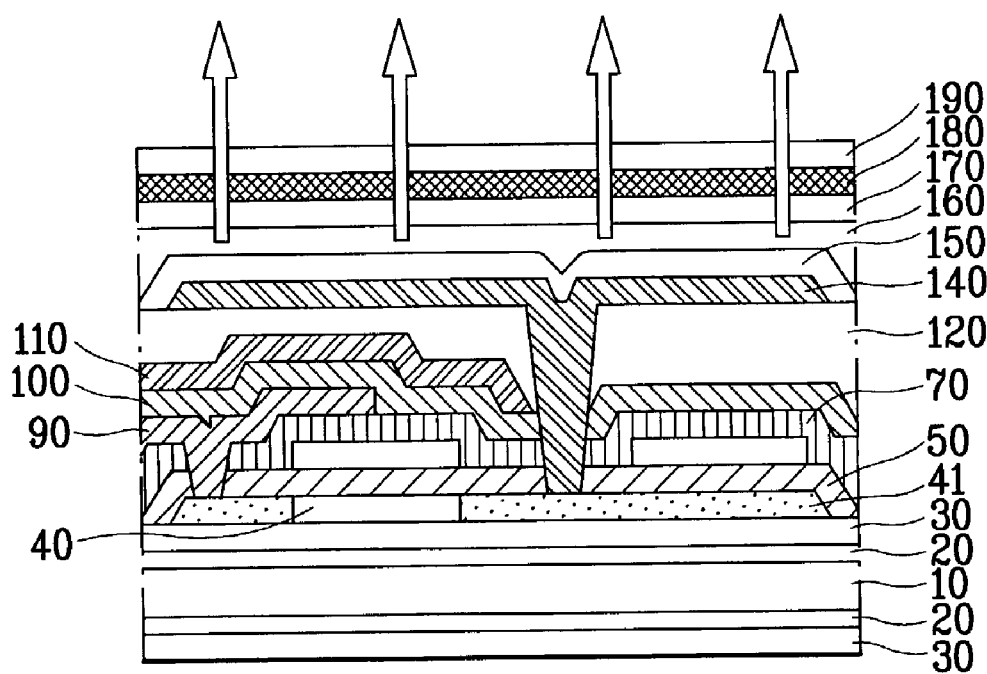

Referring to FIG. 1M, an electron injection layer, and/or an electron transport layer 170 is formed on the organic EL layer 160, and a common electrode 180 is formed thereon. Then, a transparent protection film 190 is formed on the common electrode 180, to complete fabrication of the organic EL display. The protection film 190 is formed of a transparent polymer group material for emission of a light in a top emission type.

Though a process for fabricating an organic EL display by using a transistor with a high temperature substrate is explained up to now, the thin film transistor of the present invention can be applied to a large sized reflective active matrix LCD, and the like.

Figure 2A:
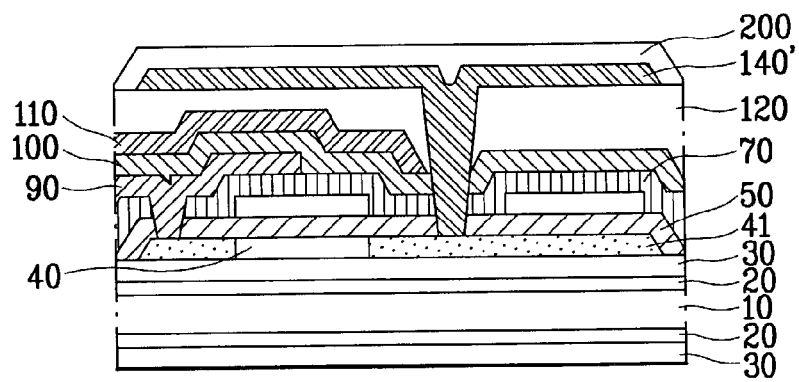
FIGS. 2A–2C illustrate sections showing the steps of a method for fabricating a reflective active matrix LCD in accordance with a preferred embodiment of the present invention.
Figure 2B:
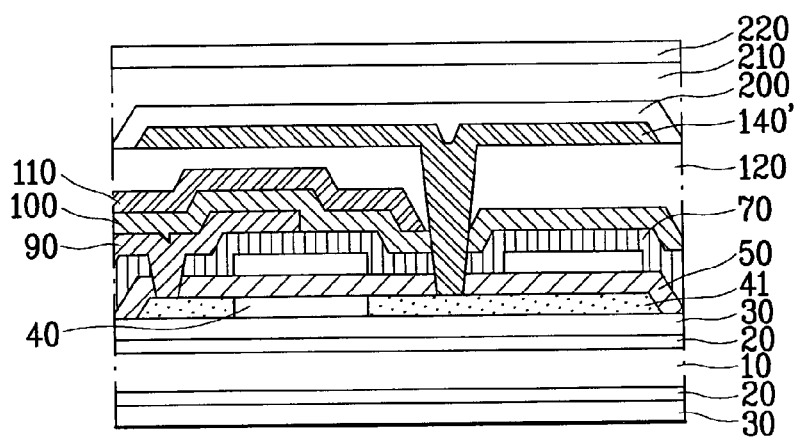
Figure 2C:
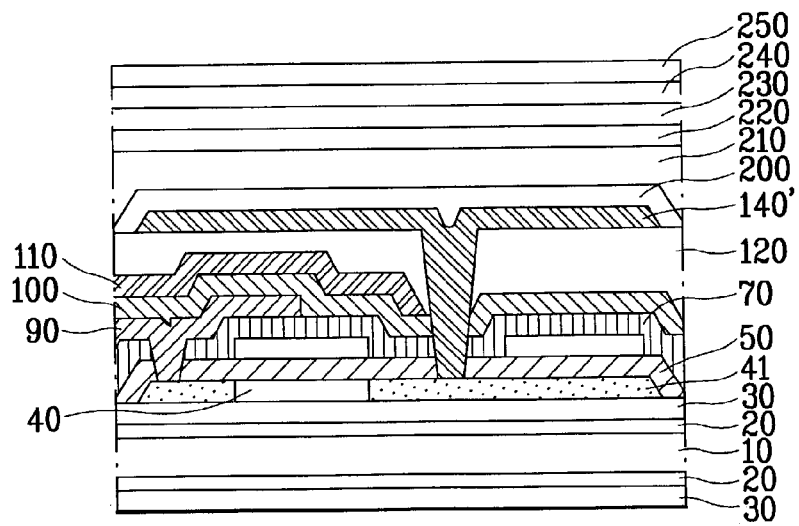

FIGS. 2A–2C illustrate sections showing the steps of a method for fabricating a reflective active matrix LCD in accordance with a preferred embodiment of the present invention. As the steps of a process for fabricating a thin film transistor is explained with reference to FIGS. 1A–1J, detailed explanation of which will be omitted.

In order to fabricate a reflective active matrix LCD, it is required that the pixel electrode 140 in the organic EL display is replaced with a conductive reflective film 140' of aluminum, or the like.

Then, referring to FIG. 2A, an orientation film 200 is formed on the conductive reflective film 140'.

Referring to FIG. 2B, after a liquid crystal layer 210 is formed on the orientation film 200, an orientation film 220 is formed on the liquid crystal layer 210.

Referring to FIG. 2C, a color filter 230, a common electrode 240, and a top plate 250 are formed on the orientation film 220 in succession, to complete fabrication of the reflective active matrix LCD.

Thus, the thin film transistor of the present invention is applicable to different displays to which a high temperature process is applicable.

As has been explained, the thin film transistor, and the organic EL display of the same and the method for fabricating the same of the present invention have the following advantages.

First, the use of a metal plate or a ceramic substrate, a substrate for use in a high temperature, permits to fabricate a thin film transistor of an excellent performance, that in turn permits to fabricate a display of an excellent performance.

Second, as the present semiconductor process is used as it is, fabrication is easy.

Third, as the substrate is formed of metal or ceramic, handling is easy, and weight, thickness, and cost of production of the product can be reduced, a production efficiency can be improved.

It will be apparent to those skilled in the art that various modifications and variations can be made in the thin film transistor, and the organic EL display of the same and the method for fabricating the same of the present invention without departing from the spirit or scope of the invention. Thus, it is intended that the present invention cover the modifications and variations of this invention provided they come within the scope of the appended claims and their equivalents.

What is claimed is:

1. An organic EL display using a thin film transistor having a substrate of ceramic and a matrix of pixel regions, the organic EL display comprising:
   the substrate of ceramic;
   a semiconductor layer formed on a region of the substrate having a source region and a drain region;
   a source electrode in contact with the source region in the semiconductor layer for use as a data line;
   a pixel electrode formed in each of the pixel region in contact with the drain region in the semiconductor layer;
   an insulating layer between the substrate and the semiconductor layer, the semiconductor layer and the source electrode, or the source electrode and the pixel electrode;
   an organic EL layer formed on the pixel electrode;
   a common electrode formed on the organic EL layer; and
   a transparent protection film formed of a polymer group on the common electrode, wherein the ceramic consists essentially of MgO group, and the substrate and the thin film transistor are used in a display device.

2. An organic EL display as claimed in claim 1, wherein the substrate of ceramic has a diagonal length of at least 10 inches.

* * * * *